United States Patent
Wu et al.

(10) Patent No.: US 7,913,196 B2
(45) Date of Patent: Mar. 22, 2011

(54) METHOD OF VERIFYING A LAYOUT PATTERN

(75) Inventors: Te-Hung Wu, Tainan County (TW); Chia-Wei Huang, Kao-Hsiung (TW); Chuen Huei Yang, Taipei (TW); Sheng-Yuan Huang, Yun-Lin County (TW); Pei-Ru Tsai, Tainan County (TW); Chih-Hao Wu, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 473 days.

(21) Appl. No.: 11/752,310

(22) Filed: May 23, 2007

(65) Prior Publication Data

US 2008/0295062 A1 Nov. 27, 2008

(51) Int. Cl.
*G06F 17/50* (2006.01)
(52) U.S. Cl. ............... 716/53; 716/50; 716/51; 716/52; 716/54; 716/56; 430/5; 430/30
(58) Field of Classification Search ............. 716/19–21, 716/4–6, 50–56; 430/5, 30
See application file for complete search history.

(56) References Cited

U.S. PATENT DOCUMENTS

| 6,218,313 B1 * | 4/2001 | Tomita et al. ............... 438/758 |
| 6,602,728 B1 | 8/2003 | Liebmann et al. |
| 6,893,800 B2 | 5/2005 | Jessen et al. |
| 6,934,929 B2 | 8/2005 | Brist et al. |
| 2002/0194576 A1 * | 12/2002 | Toyama ..................... 716/21 |
| 2003/0129509 A1 * | 7/2003 | Yamaguchi ................ 430/30 |
| 2003/0208728 A1 * | 11/2003 | Pierrat ......................... 716/4 |
| 2003/0224252 A1 * | 12/2003 | Zhou et al. ................... 430/5 |
| 2004/0139420 A1 * | 7/2004 | Brist et al. ................. 716/21 |
| 2006/0160023 A1 * | 7/2006 | Kobayashi et al. ...... 430/270.1 |
| 2007/0031745 A1 * | 2/2007 | Ye et al. ..................... 430/30 |
| 2007/0097514 A1 * | 5/2007 | Matsuzawa et al. ....... 359/659 |
| 2008/0204730 A1 * | 8/2008 | Yu et al. .................... 356/128 |

OTHER PUBLICATIONS

"Layout Manufacturability Analysis Using Rigorous 3-D Topography Simulation", by Andrzej J. Strojwas, Zhengrong Zhu, Dennis Ciplick and Xiaolei Li, IEEE @2001.*

* cited by examiner

*Primary Examiner* — Thuan Do
*Assistant Examiner* — Nha T Nguyen
(74) *Attorney, Agent, or Firm* — Winston Hsu; Scott Margo (57) ABSTRACT

A method of verifying a layout pattern comprises separately steps of obtaining a simulated pattern at a lower portion of a film by using a layout pattern as a mask to transfer the layout pattern to the film, and obtaining a simulated pattern at an upper portion of the film by using the layout pattern as a mask to transfer the layout pattern to the film. The layout pattern is verified according to the upper and lower simulated patterns.

28 Claims, 10 Drawing Sheets

METHOD OF VERIFYING A LAYOUT PATTERN

BACKGROUND OF THE INVENTION

1. Field of the Invention

The present invention relates to a semiconductor process. More particularly, the present invention relates to a method of verifying a layout pattern.

2. Description of the Prior Art

Photolithography and etching technologies are frequently used in semiconductor manufacturing. The photolithography technology usually involves transferring a complicated integrated circuit pattern to a semiconductor wafer surface for etching. These patterns must be extremely accurate for forming delicate integrated circuits. In the photolithographic step, deviations occur and jeopardize the performance of the semiconductor device when the patterns on the reticles are transferred onto the wafer surface. Such deviations are usually related with the characters of the patterns to be transferred, the topology of the wafer and various process parameters. There are many known compensations for the deviations caused by the optical proximity effect to improve the image quality after transfer. The known method is called "optical proximity correction, OPC." The commercial available OPC software repairs the layout patterns on the reticles using the theoretical image to obtain the correct image patterns on the wafer.

Figure 1:
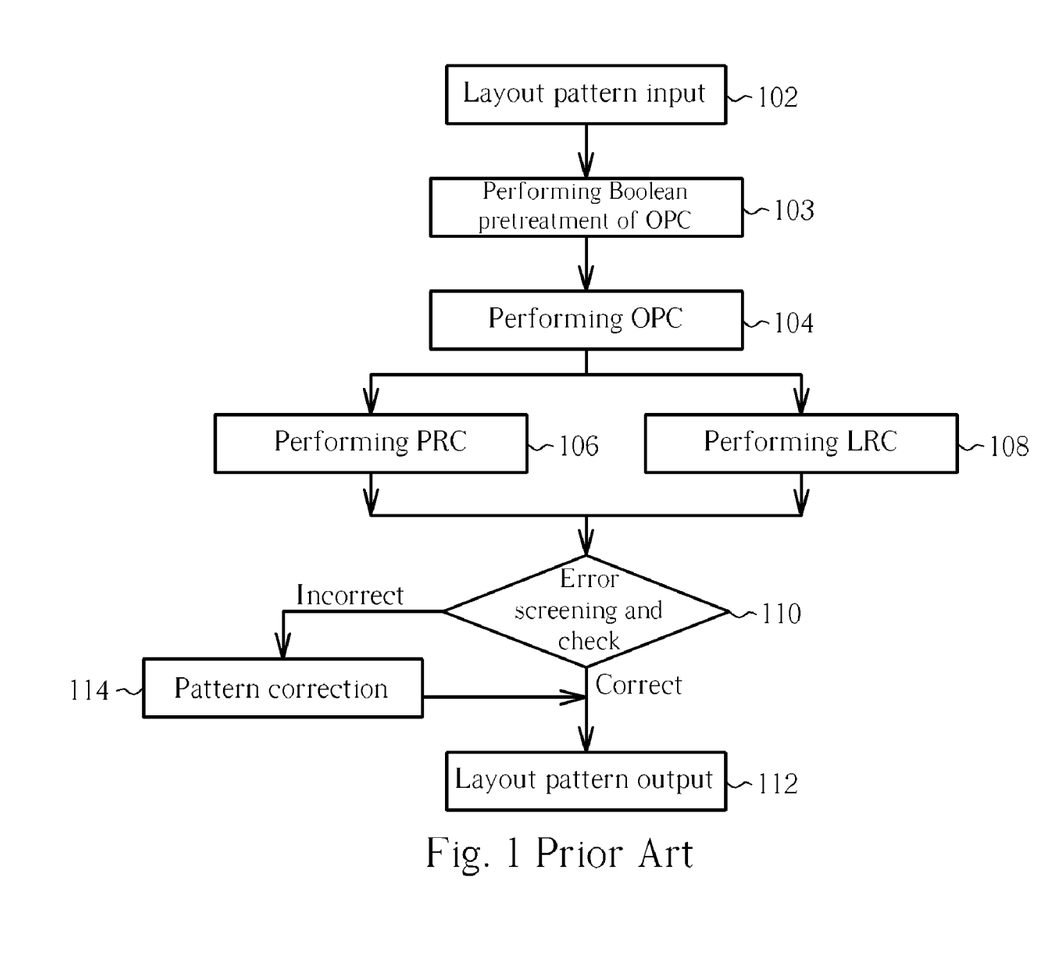
FIG. 1 is a flow chart illustrating the verification of the layout patterns on the reticles using OPC by the conventional techniques.

FIG. 1 is a flow chart illustrating the verification of the layout patterns on the reticles using OPC by the conventional techniques. First, in step 102 inputting a layout pattern is performed. Then in step 103 the Boolean pre-treatment of OPC is performed on the layout pattern to obtain a preliminary layout pattern. Afterwards in step 104 the OPC is performed to correct any particular pattern. Later, the process rule check, PRC, in step 106 and the lithography rule check, LRC, in step 108 are separately performed. Then the error screening and check in step 110 is performed. If the obtained patterns are correct and usable, the patterns are output (step 112). If incorrect, the pattern correction in step 114 is performed and the patterns are output if no error is found.

Figure 2:
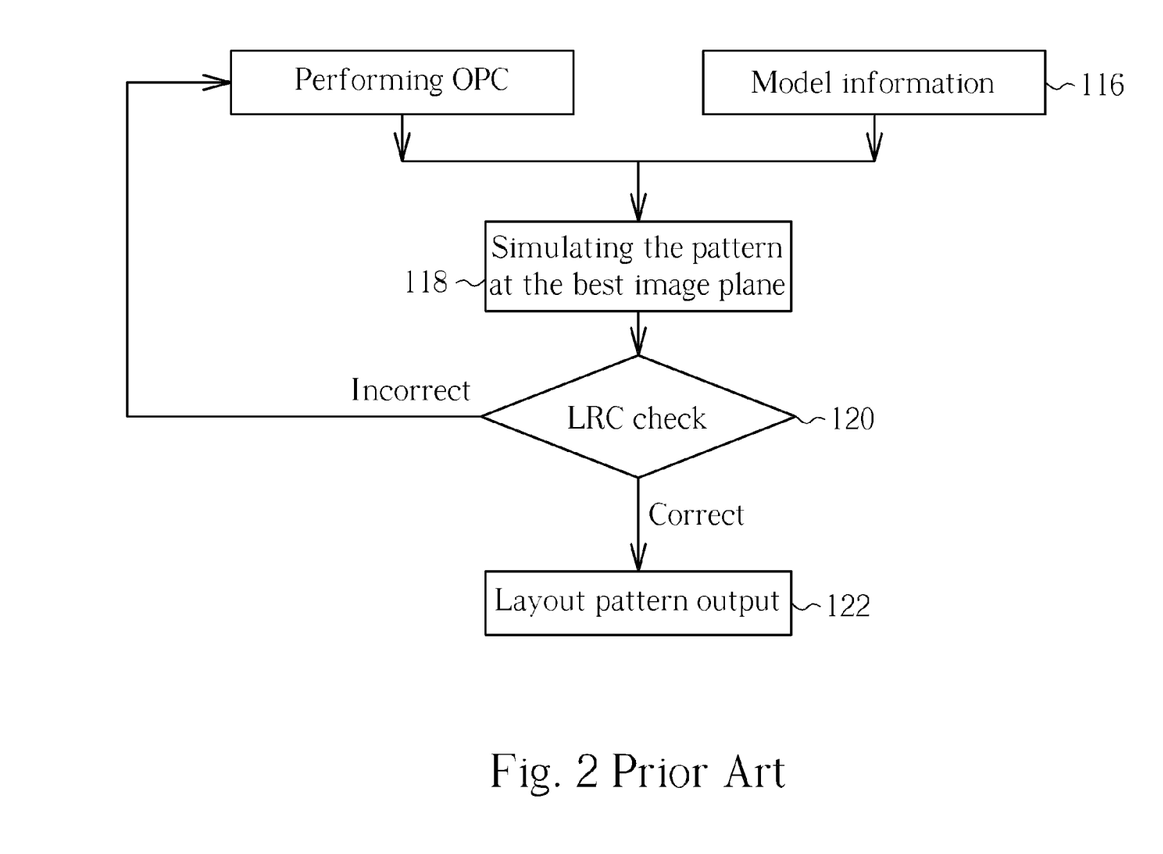
FIG. 2 is the flow chart illustrating the LRC check of the conventional techniques.

FIG. 2 is the flow chart illustrating the LRC check of step 108. First, in step 116 perform the OPC correction on the layout patterns according to the model information. The layout pattern undergoes the step 118, i.e. simulating the pattern at the best image plane of a photoresist layer resulting from a best focus exposure. The "best focus" is generally located at the half way of the thickness of the photoresist layer. The "best image plane" is referred to an image plane at the same level of the best focus on the photoresist layer resulting from the best focus exposure and a corresponding development. Afterwards, the LRC of step 120 is performed. If the image patterns are correct and usable, the layout patterns are output (in step 122). If incorrect, the OPC in step 116 is performed. Accordingly, problems such as pinch, bridge, and critical dimension uniformity are detected and the layout patterns are corrected.

Figure 3:
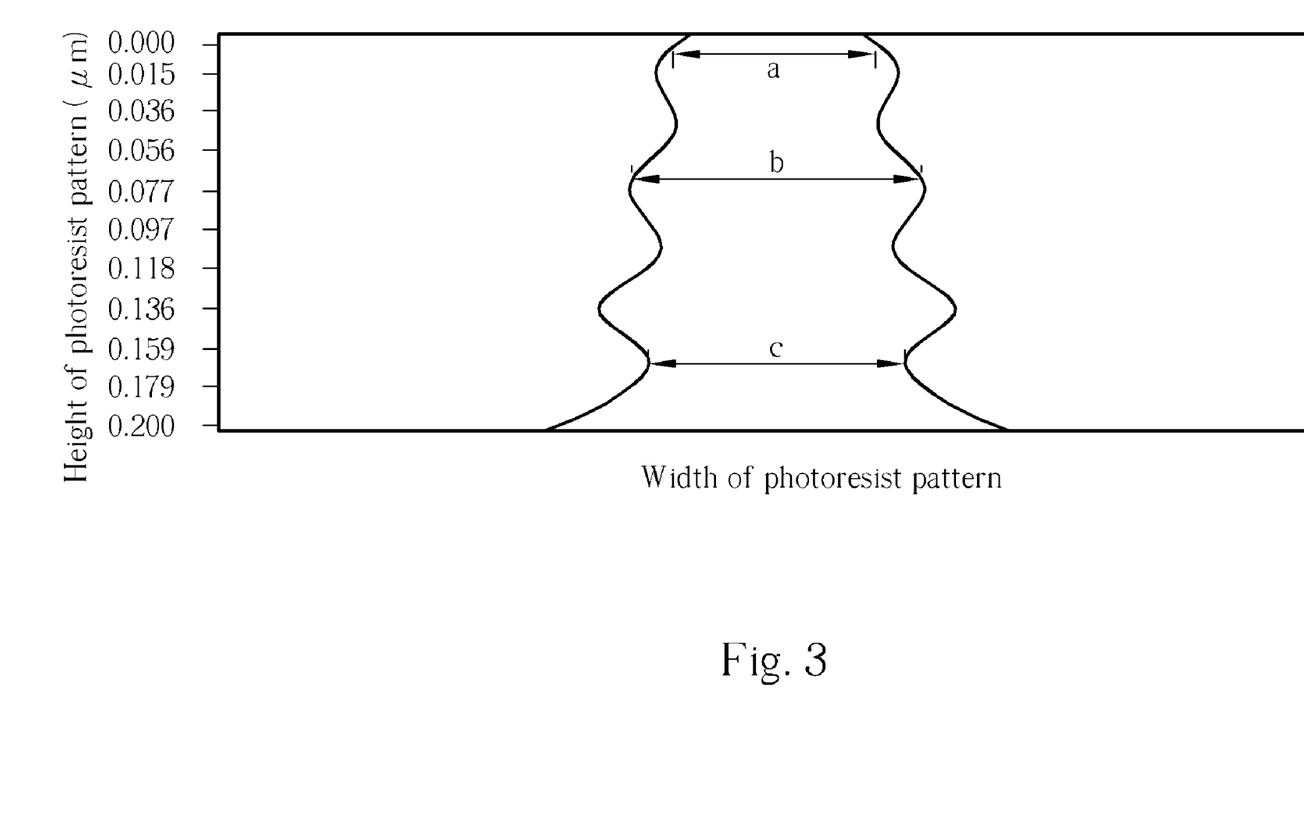
FIG. 3 illustrates a cross-sectional view of a simulated image of a photoresist layer resulting from a best focus exposure.

However, in addition to the problems such as pinch, bridge, critical dimension uniformity, and the like, pattern collapse due to undercut or film loss frequently occurs if defocus happens. They are serious 3-Dimensional configuration defects of the photoresist patterns. FIG. 3 illustrates a schematic cross-sectional view of a simulated image of a photoresist layer resulting from a best focus exposure. Because the current LRC method can only simulate the image at the best exposure plane, i.e. the image of plane b, the possible pattern defects at the top plane a or at the bottom plane c are not able to be found if the exposure is defocused.

The quality of the layout pattern is embodied by the film pattern after etching. However, simulation of the film of the pattern after etching to verify the layout pattern of the mask has never been brought forward.

Hence, there is still a need of a better method for verifying a pattern layout for confirming the layout pattern on the reticles.

SUMMARY OF THE INVENTION

One objective of the present invention is to provide a method of verifying a layout pattern for confirming if the layout pattern on the reticle are usable, to find out the possible defects such as pattern collapse and film loss of the accordingly formed layout pattern effectively and to correct the layout pattern on the reticle in time.

According to the method of verifying a layout pattern of the present invention, the method includes the following steps. First a layout pattern is provided. Then a simulated pattern at a lower portion of a film is obtained by using the layout pattern as a mask to transfer the layout pattern to the film. Still another simulated pattern at an upper portion of the film is obtained by using the layout pattern as a mask to transfer the layout pattern to the film. Afterwards the layout pattern is verified to be usable or not.

Another aspect of the present invention provides a method of verifying a layout pattern and includes the following steps. First a layout pattern is provided. An optical proximity correction is performed on the layout pattern. A simulated pattern at a lower portion of a film by using the layout pattern as a mask to transfer the layout pattern to the film, and another simulated pattern at an upper portion of the film by using a layout pattern as a mask to transfer the layout pattern to the photoresist layer are obtained. Afterwards, verification is performed to know if the simulated patterns are usable or not. When the simulated image patterns are not usable, re-perform the optical proximity correction on the layout patterns.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
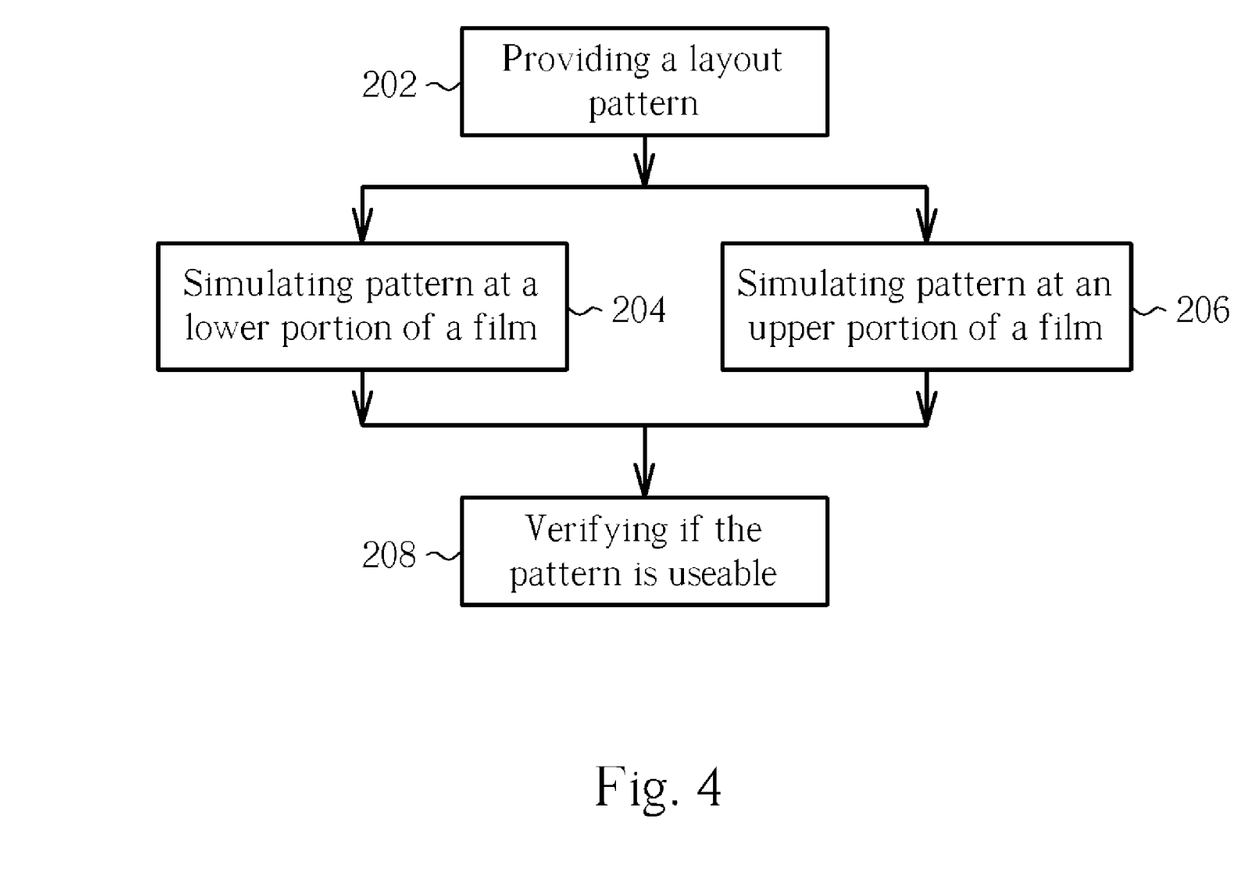
FIG. 4 is a flow chart illustrating the verification of the layout patterns by the method of the present invention.

FIG. 4 is a flow chart illustrating the verification of the layout patterns by the method of the present invention. According to the method of verifying a layout pattern of the present invention, the method includes the following steps. First in step 202 a layout pattern is provided. Then in step 204 a simulated pattern at a lower portion of a film by using the layout pattern as a mask to transfer the layout pattern to the film is obtained. Step 206 is independently carried out with respect to step 204 to obtain another simulated pattern at an upper portion of the film by using the layout pattern as a mask to transfer the layout pattern to the film. Afterwards in step 208 whether the layout pattern is usable or not is verified.

The layout pattern according to the method of verifying a layout pattern of the present invention may be a layout pattern of a reticle. Accordingly, in accordance with the method of verifying a layout pattern of the present invention, the method can be applied to the verification of the layout pattern of a reticle. Once the layout pattern is verified to be usable, i.e. the obtained film pattern has no defects, it is can be actually produced.

Herein, "the film" is referred to anything, such as a photoresist layer or a layer covered by a photoresist layer, having a layout pattern transferred from a mask with the layout pattern. Additionally, the layer covered by the photoresist layer is the layer to be etched, such as the Si layer, oxide layer, nitride layer or the like in the semiconductor process.

Taking the photoresist layer as the film for example, in step 204, a simulated image pattern at a lower portion of a photoresist layer is obtained resulting from a simulation exposure of a photoresist layer using the layout pattern provided in step 202 as a mask to transfer the layout pattern to the photoresist layer; and in step 206 the simulated image pattern at an upper portion of the photoresist layer is obtained resulting from a simulation exposure of the same photoresist layer using the layout pattern provided in step 202 as a mask to transfer the layout pattern to the photoresist layer. It is noted that the step 204 and the step 206 are not in any special order and are independently carried out, i.e. simulated image patterns are independently obtained at a lower and an upper portion of a photoresist layer resulting from a separate simulation exposure of a same photoresist layer.

If the photoresist layer is a positive photoresist, the exposure in step 204 may be preferably a negative defocus simulation to simulate the image pattern obtained at a lower portion of the photoresist layer resulting from a simulation exposure and the corresponding development. Preferably, an image pattern is obtained from the photoresist layer at a same level for verification. For example, if the image pattern obtained at a lower portion of the photoresist layer is broken or so narrow that it may collapse during manufacturing processes, it may not be usable. The image pattern obtained at a lower portion of the photoresist layer may preferably be an image pattern at the bottom.

"Negative defocus" generally means the focus is below the best exposure focal point. Generally speaking, in negative defocus the light intensity at the lower portion of the photoresist layer is stronger and over-exposure happens at the lower portion or at the bottom of the photoresist layer. For the positive photoresist, the line width of the photoresist patterns at the lower portion after development is relatively narrower. Once too narrow or lost, the photoresist pattern lines may collapse.

Figure 5:
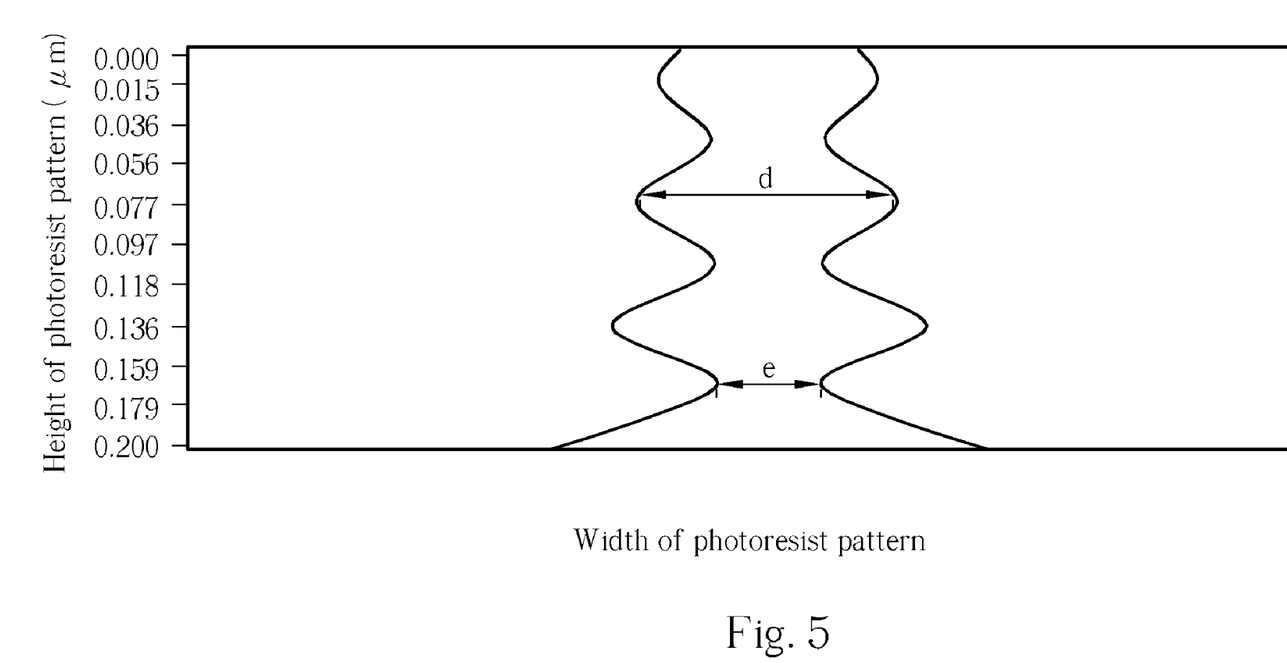
FIG. 5 illustrates a cross-sectional view of a simulated pattern obtained after exposure and development of a photoresist layer under a negative defocus condition.
Figure 6:
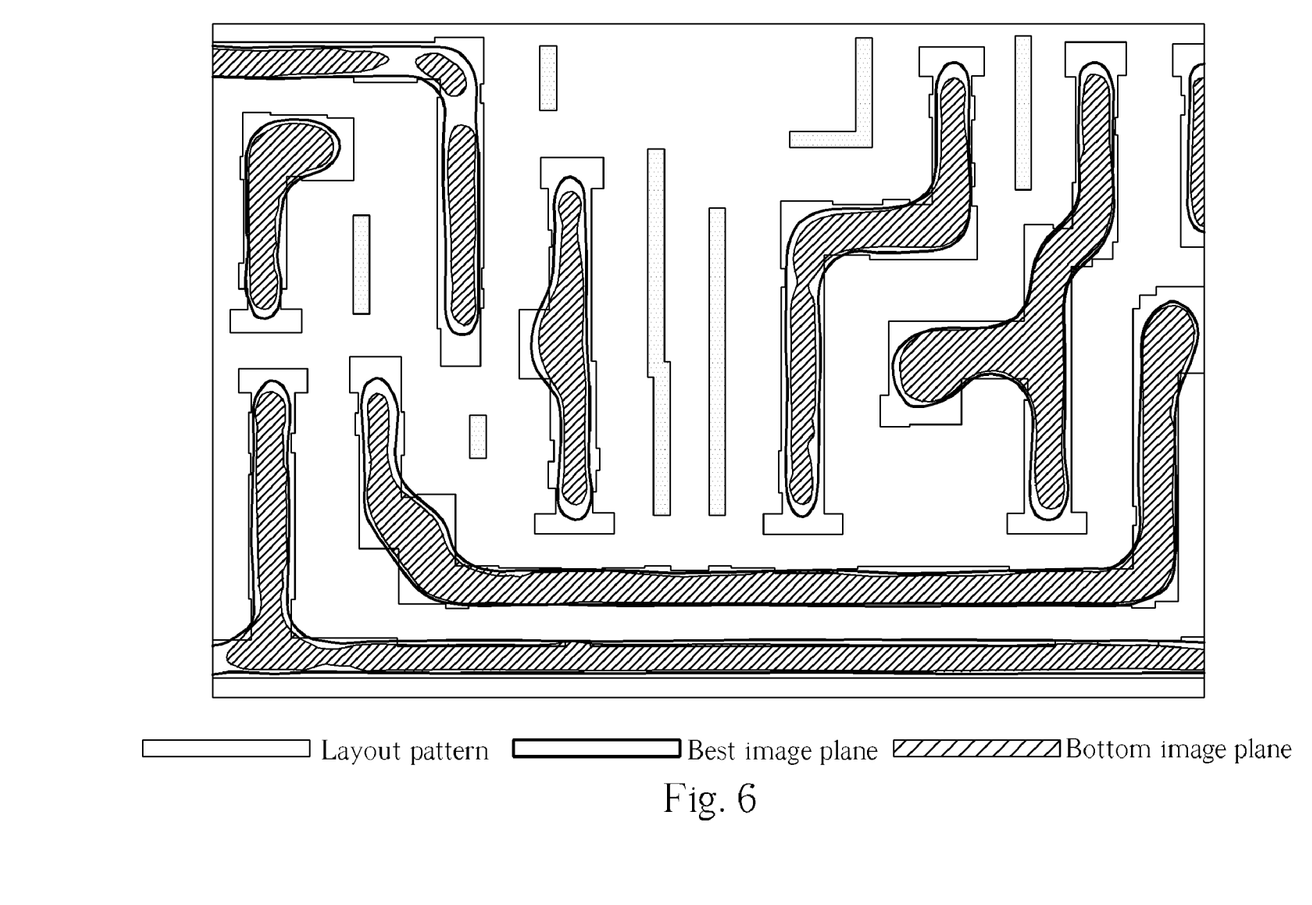
FIG. 6 illustrates a simulated image pattern according to the method of verifying a layout pattern of the present invention.

FIG. 5 illustrates a cross-sectional view of a simulated pattern obtained after exposure and development of a photoresist layer under a negative defocus condition. The simulated pattern is obtained by using a computer to execute a simulation software from Mentor Graphics Corporation. As shown, the patterns at the best image plane "d" still have a good line width but the patterns at the bottom image plane "e" have a relatively narrower line width. Consequently, the simulated image pattern which is obtained at the bottom image plane of the positive photoresist after exposure under a negative defocus condition would help for understanding whether the obtained pattern is usable or not. FIG. 6 illustrates an example of a simulated image pattern obtained at the bottom image plane according to the method of verifying a layout pattern of the present invention. Compared with the simulated image pattern obtained at the best image plane, it is clear that the pattern includes broken and too narrow lines. The obtained photoresist pattern may tend to collapse due to undercut and it is determined that the layout pattern is not usable and requires further correction.

If the photoresist layer is a positive photoresist, the exposure in step 206 may be preferably a positive defocus simulation to simulate the image pattern obtained at an upper portion of the photoresist layer resulting from a simulation exposure and the corresponding development. Preferably, an image pattern is obtained from the photoresist layer at a same level. So, the obtained simulated image pattern is determined as desired to see if it is usable, i.e. whether the image pattern obtained at an upper portion of the photoresist layer is so narrow that it may be lost during manufacturing processes. If the image pattern obtained at an upper portion of the photoresist layer does not exist or is so narrow that it may be lost, it may not be usable. The image pattern obtained at an upper portion of the photoresist layer may preferably be an image pattern at the top.

Figure 7:
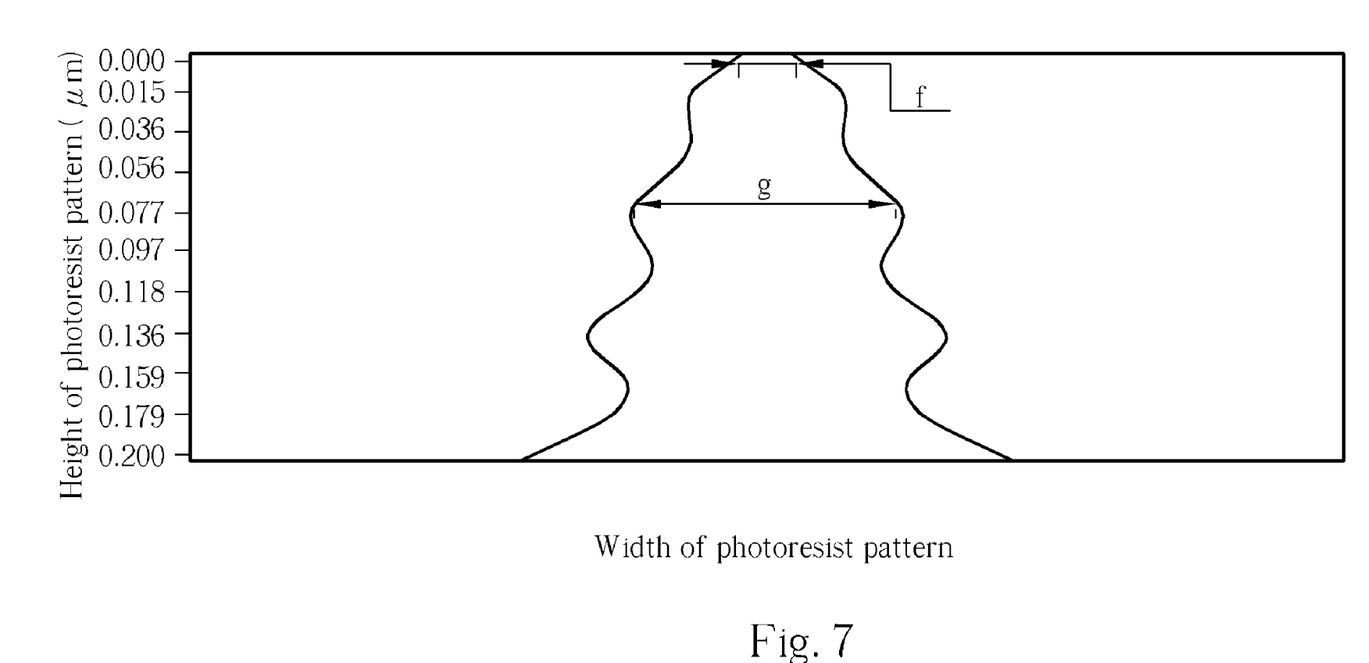
FIG. 7 illustrates a cross-sectional view of a simulated pattern obtained after exposure and development of a photoresist layer under a positive defocus condition.
Figure 8:
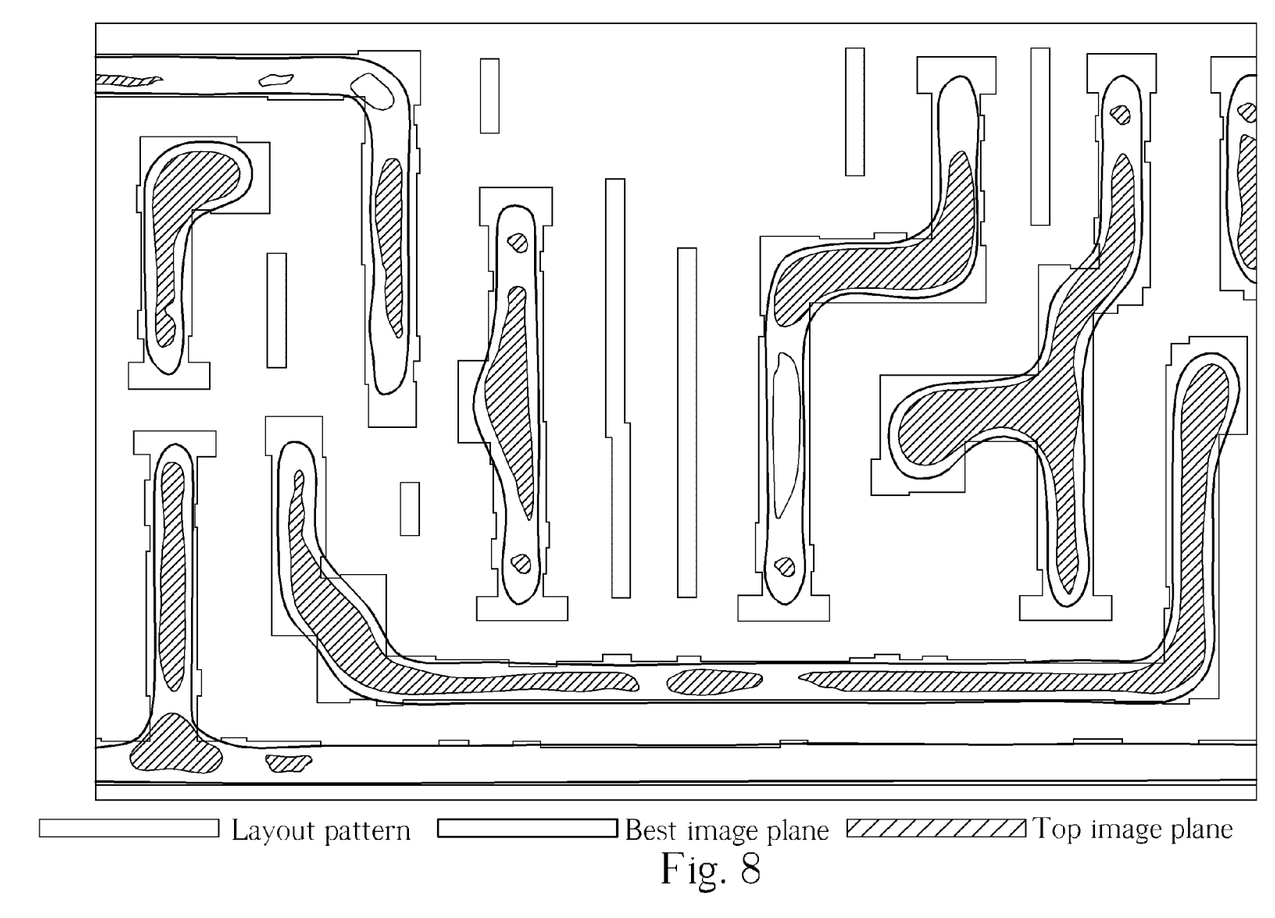
FIG. 8 illustrates a simulated image pattern obtained according to the method of verifying a layout pattern of the present invention.

"Positive defocus" generally means the focus is above the best exposure focal point. Generally speaking, in a positive defocus the light intensity at the upper portion of the photoresist layer is stronger. For the positive photoresist, the line width of the photoresist patterns at the upper portion after development is relatively narrower. Once too narrow or lost, the photoresist pattern lines may discontinue. FIG. 7 illustrates a cross-sectional view of a simulated pattern obtained after exposure and development of a photoresist layer under a positive defocus condition. As shown, the patterns at the best image plane "g" still have a good line width but the patterns at the top image plane "f" have a relatively narrower line width. Consequently, the simulated image pattern which is obtained at the top image plane of the positive photoresist after exposure under a positive defocus condition would help for understanding whether the obtained pattern is usable or not. FIG. 8 illustrates an example of a simulated image pattern obtained at the top image level according to the method of verifying a layout pattern of the present invention. Compared with the simulated image pattern obtained at the best image plane, it is clear that the pattern includes broken and too narrow lines. The obtained photoresist pattern may tend to have film loss and it is determined that the layout pattern is not usable and requires further correction.

The negative defocus may be a negative limit of a process window and the positive defocus may be a positive limit of a process window. In such a way, the layout pattern can be verified to be usable or not between the positive and negative limit of a process window.

In addition to using positive/negative defocus to obtain the simulated image pattern at the upper/lower portion of the photoresist layer, a simulated image pattern at the best image plane of the photoresist layer resulting from a best focus exposure of the photoresist layer using the layout pattern as a mask to transfer the layout pattern to the photoresist layer may be obtained for the further verification of the layout pattern.

On the other hand, if the photoresist layer is a negative photoresist, the result is contrary to what it is for a positive photoresist exposed using a negative or a positive defocus in order to obtain the simulated image pattern at the upper/lower portion of the photoresist layer resulting from an exposure. In other words, a positive defocus is preferably used to obtain the simulated image pattern at the lower portion of the photoresist layer and a negative defocus is preferably used to obtain the simulated image pattern at the upper portion of the photoresist layer.

Additionally, a simulated image pattern at the best image plane of the photoresist layer resulting from a best focus exposure of the photoresist layer using the layout pattern as a mask to transfer the layout pattern to the photoresist layer may be obtained for the verification of the layout pattern.

Taking the layer to be etched as the film for example, step 204 and step 206 may be carried out as follows. A simulated pattern at a lower portion of the layer to be etched is obtained using the layout pattern as a mask to transfer the layout pattern to the layer to be etched by performing a first lithographic and etching process, that is, to pattern the photoresist layer on the layer to be etched through the lithographic process and to etch the layer to be etched underneath the photoresist layer through the etching process. Another simulated pattern at an upper portion of the layer to be etched is obtained using the layout pattern as a mask to transfer the layout pattern to the layer to be etched by performing a second lithographic and etching process to pattern the photoresist layer on the layer to be etched through the lithographic process and to etch the layer to be etched underneath the photoresist layer through the etching process. Further, the first lithographic and etching process may use the upper limit of a process window and the second lithographic and etching process may use the lower limit of a process window. Or alternatively, the first lithographic and etching process may use the lower limit of a process window and the second lithographic and etching process may use the upper limit of a process window. In addition to the steps to obtain the simulated patterns at a lower/upper portion of the layer to be etched, the best simulated etching pattern at the layer to be etched is obtained by using the layout pattern as a mask and performing a lithographic and etching process of the best conditions to transfer the layout pattern to the layer to be etched.

Figure 9:
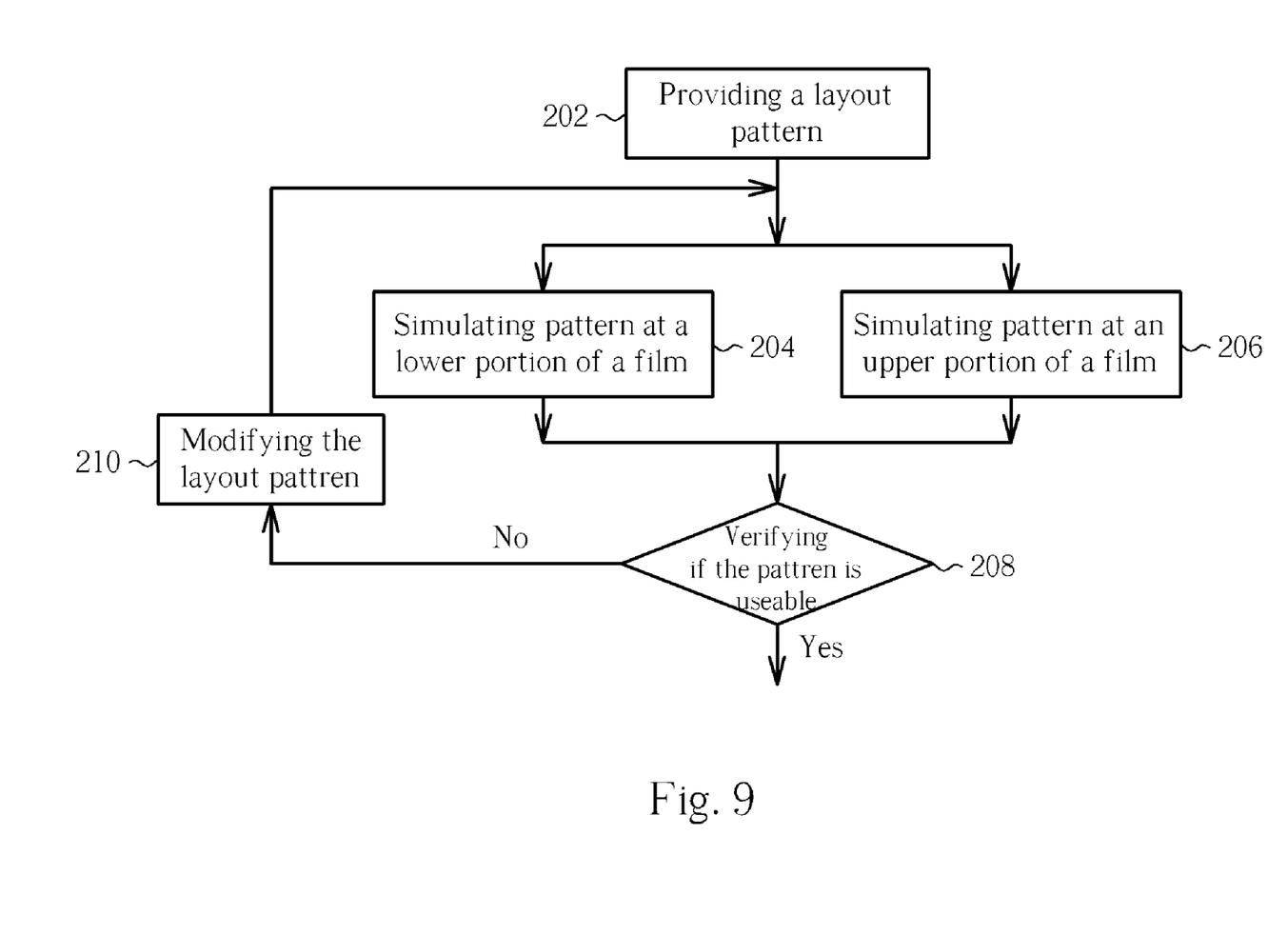
FIG. 9 illustrates an embodiment of the present invention.

FIG. 9 illustrates an embodiment of the present invention. After verifying if the layout pattern is usable according to the method of the present invention, the method of the present invention may further include modifying the layout pattern in step 210 when any one of the simulated image patterns, i.e. the simulated pattern at the upper or lower portion of the film, is not usable due to loss or collapse. The modification may be performed using an optical proximity correction. The verification for the image patterns may be carried out by, for example, a lithography rule check.

Figure 10:
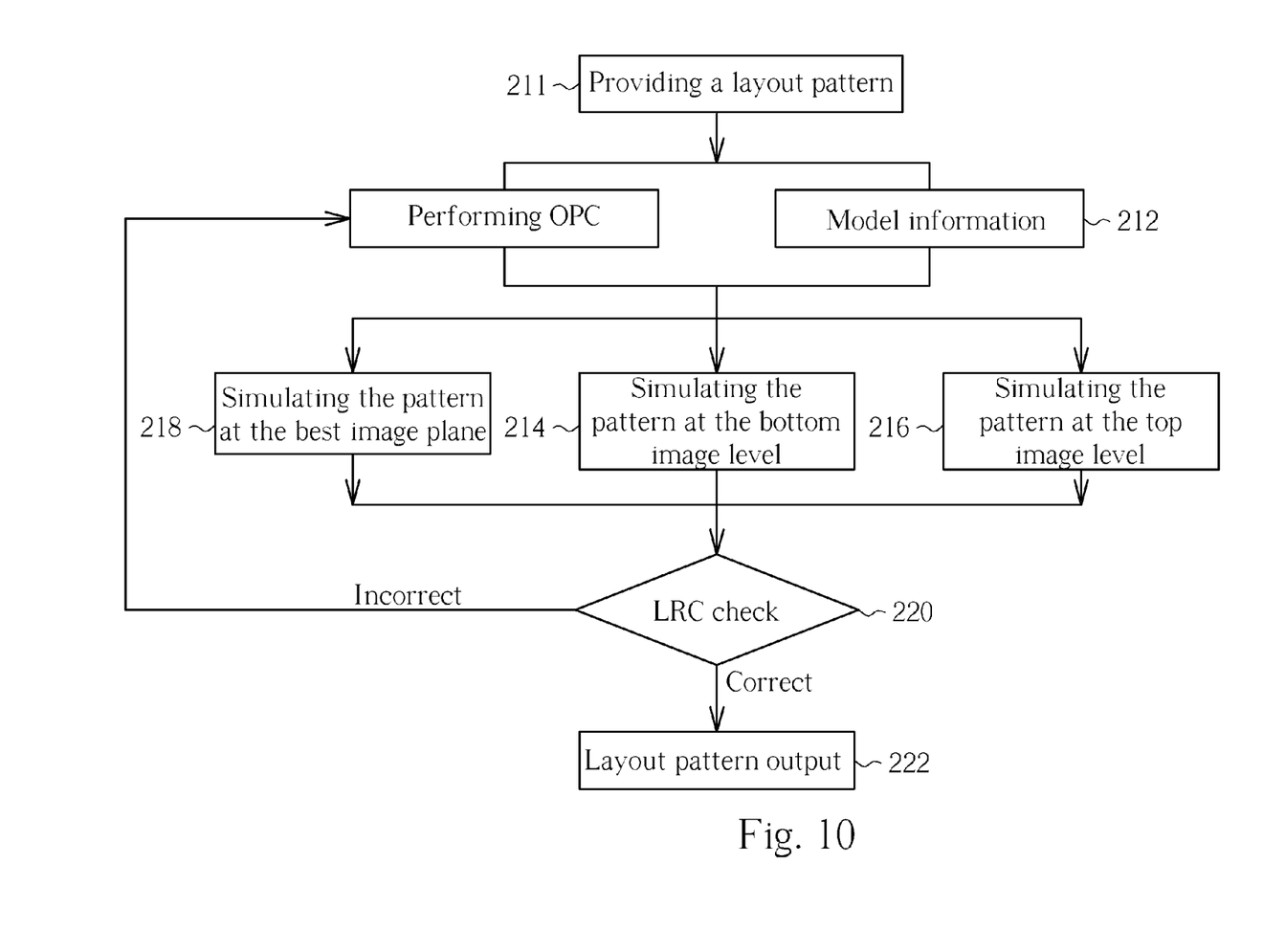
FIG. 10 illustrates an embodiment of the present invention.

In another aspect of the present invention, a method of verifying a layout pattern may be further provided by utilizing the above-mentioned method of verifying a layout pattern according to the present invention. FIG. 10 illustrates an embodiment of the present invention. First, in step 211, a layout pattern is provided. Next, in step 212, the OPC correction on the layout pattern according to a model information is performed. Then in step 214 a simulated image pattern at a lower portion of a film resulting from an exposure of the film using the layout pattern as a mask to transfer the layout pattern to the film is obtained. The step 214 resembles the step 204. For example, providing the film is a positive photoresist, a negative defocus of a negative limit of a process window is used to expose the positive photoresist and to obtain the simulated image pattern at the bottom of the photoresist. And in step 216 another simulated image pattern at an upper portion of a film resulting from an exposure of the film using the layout pattern as a mask to transfer the layout pattern to the film is obtained. The step 216 resembles the step 206. For example, providing the film is a positive photoresist, a positive defocus of a positive limit of a process window is used to expose the positive photoresist and to obtain the simulated image pattern at the top of the photoresist.

An optional step 218 may be carried out to obtain the simulated image pattern at the best image plane of the photoresist layer resulting from a best focus exposure of the photoresist layer using the layout pattern as a mask to transfer the layout pattern to the photoresist layer. Afterwards, the LRC of step 220 is performed to verify the pattern. If the image patterns are correct and usable, the layout patterns are output (in step 222). If incorrect, the OPC is re-performed in step 212 to modify the layout pattern according to the loss of the simulated pattern of the obtained film, i.e. the extent of the modification in the OPC is based on the lost area of the simulated pattern. Accordingly, the layout pattern is verified and the poor layout pattern is further effectively corrected.

The method of verifying a layout pattern of the present invention can effectively simulate a photoresist pattern or other patterns. For example, it can be directly applied to the OPC. Or those patterns can be verified by the method of the present invention after verified by conventional OPC, and then a further correction of the layout pattern may be performed. The method of the present invention may be applied in etching techniques. The formed simulated etching pattern is verified to know if usable after simulation. The method of the present invention may be applied in any lithographic technique, such as regular lithography, resolution enhancement technique (RET), double dipole lithography (DDL), double patterning, resolution enhancement of lithography by assist of chemical shrink (RELAS), thermal flow, shrink assist film for enhanced resolution (SAFIER), and the like. The application of the method of the present invention can prevent the yield loss from bad operational conditions and reduce the reticle tape out cost/cycle time. Moreover, the method of the present invention can verify a 3-Dimensional pattern, which is better than the conventional 2-Dimensional verification by OPC. This is of particular importance for a 45 nm process because collapse of the line pattern with a CD size and film loss on the top of the photoresist layer, which may lead to device performance deterioration, can be avoided.

All combinations and sub-combinations of the above-described features also belong to the present invention. Those skilled in the art will readily observe that numerous modifications and alterations of the device and method may be made while retaining the teachings of the invention.

What is claimed is:

1. A method of verifying a layout pattern, comprising:
   providing a layout pattern;
   providing a film having a lower portion and an upper portion with respect to a direction of a thickness of said film;
   obtaining a simulated pattern on a plane at a same level in said lower portion of said film by performing a first simulation of transferring said layout pattern to said film using a mask having said layout pattern by using a computer;

obtaining another simulated pattern on a plane at a same level in said upper portion of said film by performing a second simulation of transferring said layout pattern to said film using a mask having said layout pattern; and verifying if said layout pattern is usable through performing a lithography rule check of each of said simulated pattern and said another simulated pattern, wherein when said layout pattern is verified to be not usable, an optical proximity correction is performed on said layout pattern to modify said layout pattern.

2. The method of claim 1, wherein, said film comprises a positive photoresist layer;

obtaining said simulated pattern at said lower portion of said film by performing said first simulation of transferring said layout pattern to said film using the mask having said layout pattern is to obtain a simulated image pattern at a lower portion of said photoresist layer resulting from a first exposure of said photoresist layer using said layout pattern as a mask to transfer said layout pattern to said photoresist layer; and obtaining said another simulated pattern at said upper portion of said film by performing said second simulation of transferring said layout pattern to said film using said mask having said layout pattern is to obtain another simulated image pattern at an upper portion of said photoresist layer resulting from a second exposure of said photoresist layer using said layout pattern as a mask to transfer said layout pattern to said photoresist layer.

3. The method of claim 2, wherein said first exposure is performed using a negative defocus and said second exposure is performed using a positive defocus.

4. The method of claim 3, wherein said negative defocus is a negative limit of a process window and said positive defocus is a positive limit of a process window.

5. The method of claim 2, further comprising:

obtaining a simulated image pattern at the best image plane of said photoresist layer resulting from a best focus exposure of said photoresist layer using said layout pattern as a mask to transfer said layout pattern to said photoresist layer.

6. The method of claim 1, wherein said simulated pattern at said lower portion is a simulated pattern at the bottom of said film.

7. The method of claim 1, wherein said simulated pattern at said upper portion is a simulated pattern at the top of said film.

8. The method of claim 1, wherein, said film comprises a negative photoresist layer;

obtaining said simulated pattern at said lower portion of said film by performing said first simulation of transferring said layout pattern to said film using said mask having said layout pattern is to obtain a simulated image pattern at a lower portion of said photoresist layer resulting from a third exposure of said photoresist layer using said layout pattern as a mask to transfer said layout pattern to said photoresist layer; and obtaining said another simulated pattern at said upper portion of said film by performing said second simulation of transferring said layout pattern to said film using said mask having said layout pattern is to obtain another simulated image pattern at an upper portion of said photoresist layer resulting from a fourth exposure of said photoresist layer using said layout pattern as a mask to transfer said layout pattern to said photoresist layer.

9. The method of claim 8, wherein said third exposure is performed using a positive defocus and said fourth exposure is performed using a negative defocus.

10. The method of claim 9, wherein said positive defocus is a positive limit of a process window and said negative defocus is a negative limit of a process window.

11. The method of claim 1, wherein, said film comprises a Si layer, an oxide layer, or a nitride layer;

said first simulation transferring said layout pattern to said film using said mask having said layout pattern comprises a simulation of a first lithographic and etching process using said layout pattern as a mask to transfer said layout pattern to said Si layer, an oxide layer, or a nitride layer; and said second simulation of transferring said layout pattern to said film using said mask having said layout pattern comprises a simulation of a second lithographic and etching process using said layout pattern as a mask to transfer said layout pattern to said Si layer, an oxide layer, or a nitride layer.

12. The method of claim 11, wherein said first lithographic and etching process is performed using the upper limit of a process window thereof, and said second lithographic and etching process is performed using the lower limit of a process window thereof.

13. The method of claim 11, wherein said first lithographic and etching process is performed using the lower limit of a process window thereof, and said second lithographic and etching process is performed using the upper limit of a process window thereof.

14. The method of claim 11, further comprising:

obtaining the best simulated etching pattern of said layer to be etched by using said layout pattern as a mask and performing a lithographic and etching process of the best conditions to transfer said layout pattern to said layer to be etched.

15. A method of verifying a layout pattern, comprising:

providing a layout pattern;

performing an optical proximity correction on said layout pattern according to a model information;

providing a film having a lower portion and an upper portion with respect to a direction of a thickness of said film;

obtaining a simulated pattern on a plane at a same level in said lower portion of said film by performing a first simulation of transferring said layout pattern to said film using a mask having said layout pattern and obtaining another simulated pattern on a plane at a same level in said upper portion of said film by performing a second simulation of transferring said layout pattern to said film using said mask having said layout pattern by using a computer;

verifying if said simulated patterns are usable through performing a lithography rule check of each of said simulated pattern and said another simulation pattern; and re-performing said optical proximity correction on said layout pattern to modify said layout pattern when any of said simulated patterns is not usable.

16. The method of claim 15, wherein, said film comprises a positive photoresist layer;

the step of obtaining said simulated pattern at said lower portion of said film by performing said first simulation of transferring said layout pattern to said film using said mask having said layout pattern is to obtain a simulated image pattern at a lower portion of said photoresist layer resulting from a first exposure of said photoresist layer using said layout pattern as a mask to transfer said layout pattern to said photoresist layer; and the step of obtaining another simulated pattern at said upper portion of said film by performing said second simulation of transferring said layout pattern to said film using said mask having said layout pattern is to obtain another simulated image pattern at an upper portion of said photoresist layer resulting from a second exposure of said photoresist layer using said layout pattern as a mask to transfer said layout pattern to said photoresist layer.

17. The method of claim 16, wherein said first exposure is performed using a negative defocus and said second exposure is performed using a positive defocus.

18. The method of claim 17, wherein said negative defocus is a negative limit of a process window and said positive defocus is a positive limit of a process window.

19. The method of claim 16, further comprising:
obtaining a simulated image pattern at the best image plane of said photoresist layer resulting from a best focus exposure of said photoresist layer using said layout pattern as a mask to transfer said layout pattern to said photoresist layer.

20. The method of claim 15, wherein,
said film comprises a negative photoresist layer;
the step of obtaining said simulated pattern at said lower portion of said film by performing said first simulation of transferring said layout pattern to said film using said mask having said layout pattern is to obtain a simulated image pattern at a lower portion of said photoresist layer resulting from a first exposure of said photoresist layer using said layout pattern as a mask to transfer said layout pattern to said photoresist layer; and the step of obtaining another simulated pattern at said upper portion of said film by performing said second simulation of transferring said layout pattern to said film using said mask having said layout pattern is to obtain another simulated image pattern at an upper portion of said photoresist layer resulting from a second exposure of said photoresist layer using said layout pattern as a mask to transfer said layout pattern to said photoresist layer.

21. The method of claim 20, wherein said first exposure is performed using a positive defocus and said second exposure is performed using a negative defocus.

22. The method of claim 21, wherein said positive defocus is a positive limit of a process window and said negative defocus is a negative limit of a process window.

23. The method of claim 20, further comprising:
obtaining a simulated image pattern at the best image plane of said photoresist layer resulting from a best focus exposure of said photoresist layer using said layout pattern as a mask to transfer said layout pattern to said photoresist layer.

24. The method of claim 15, wherein,
said film comprises a Si layer, an oxide layer, or a nitride layer;
said first simulation transferring said layout pattern to said film using said mask having said layout pattern comprises a simulation of a first lithographic and etching process using said layout pattern as a mask to transfer said layout pattern to said Si layer, an oxide layer, or a nitride layer; and
said second simulation of transferring said layout pattern to said film using said mask having said layout pattern comprises a simulation of a second lithographic and etching process using said layout pattern as a mask to transfer said layout pattern to said Si layer, an oxide layer, or a nitride layer.

25. The method of claim 24, wherein said first lithographic and etching process is performed using the upper limit of a process window thereof and said second lithographic and etching process is performed using the lower limit of a process window thereof.

26. The method of claim 24, wherein said first lithographic and etching process is performed using the lower limit of a process window thereof and said second lithographic and etching process is performed using the upper limit of a process window thereof.

27. The method of claim 26, further comprising:
obtaining the best simulated etching pattern of said layer to be etched by using said layout pattern as a mask and performing a lithographic and etching process of the best conditions to transfer said layout pattern to said layer to be etched.

28. The method of claim 15, wherein, when any one of said simulated patterns is not usable, re-performing said optical proximity correction on said layout pattern and the extent of said optical proximity correction is based on the not usable simulated patterns.

* * * * *